United States Patent [19]
Pelz et al.

[11] Patent Number: 5,737,345
[45] Date of Patent: Apr. 7, 1998

[54] METHOD FOR ARITHMETIC DECODING

[75] Inventors: Rodolfo Mann Pelz, Hanover; Bechir Jannet, Pattensen, both of Germany

[73] Assignee: Robert Bosch GmbH, Stuttgart, Germany

[21] Appl. No.: 517,540

[22] Filed: Aug. 21, 1995

[30] Foreign Application Priority Data

Aug. 19, 1994 [DE] Germany ............... 44 29 585.5

[51] Int. Cl.$^6$ ................................ H03M 13/12
[52] U.S. Cl. .............................. 371/43.1
[58] Field of Search ...................... 371/43

[56] References Cited

U.S. PATENT DOCUMENTS

| | | | |
|---|---|---|---|
| 4,792,954 | 12/1988 | Arps et al. | 371/48 |
| 5,025,258 | 6/1991 | Duttweiler | 341/107 |
| 5,167,034 | 11/1992 | MacLean, Jr. et al. | 395/575 |
| 5,581,481 | 12/1996 | Weerackody et al. | 364/514 R |

OTHER PUBLICATIONS

Langdon, "An Introduction to Arithmetic Coding", IBM Journal of Research and Development, vol. 28, No. 2, Mar. 1984, pp. 135-149.

R. Mann Pelz, "Bild- und Sprach übertragung in Mobilfunk-kan älen" (Transmission of Image and speech in Mobile Radio Telephone Channels), Nachrichtentechnik, Elektronik, Berlin 42, 1992, p. 7 ff.

I.H. Witten, et al., "Arithmetic Coding for Datacompression", Communications of the ACM, Computing Practices, Jun. 1987, vol. 30, No. 6, p. 520 ff.

Hagenauer "A Viterbi Algorithm with Soft-Decision Outputs and its Applications", Global Telecommunications Conference, Dallas, 1989, p., 1680 ff.

*Primary Examiner*—Stephen M. Baker
*Attorney, Agent, or Firm*—Kenyon & Kenyon

[57] ABSTRACT

A method for arithmetic decoding improves the reliability of the arithmetic coding. For the purpose of channel decoding, use is made of a soft output Viterbi algorithm which, along-side the decided data item, supplies an item of reliability information. In addition, a data item is predicted for the decided data item in accordance with channel-decoded and arithmetically decoded data already transmitted, and subsequently arithmetically coded and compared with the channel-decoded data item. If the two data items do not correspond, the distribution density function used for the arithmetic decoding is changed by using the reliability information, and the channel-decoded data item is subsequently arithmetically decoded using the new distribution density function.

8 Claims, 2 Drawing Sheets

5,737,345

METHOD FOR ARITHMETIC DECODING

BACKGROUND INFORMATION

U.S. Pat. No. 5,025,258 describes a method for arithmetic decoding, in which there is a change in the distribution density function of the transmitted data during transmission. For this purpose, an adaptive probability estimate, that is to say an estimate of the distribution density function, of the transmitted and of the received data is carried out both at the receiver end and at the transmitter end, and the estimated distribution density function is made available to the arithmetic encoder and the arithmetic decoder for arithmetic encoding and arithmetic decoding, respectively. The decided data are taken into account in the probability estimate at the receiver end. No estimate is performed as to whether the decided data were wrongly decided on the basis of a transmission error. Consequently, transmission errors are not taken into account in the arithmetic decoding. This leads to a higher error rate.

Furthermore, it is known from R. Mann Pelz, "Bildund Sprachübertragung in Mobilfunk-kanälen" ("Transmission of Image and Speech in Mobile Radio Telephone Channels"), Nachrichtentechnik, elektronik, Berlin 42, 1992, pages 7 ff, to use a soft output Viterbi algorithm in channel coding and channel decoding. The soft output Viterbi algorithm (SOVA) supplies an item of reliability information which specifies the probability that the decided data item has been correctly decided.

SUMMARY OF THE INVENTION

The method according to the present invention has the advantage that the channel-coded data are channel-decoded in accordance with the soft output Viterbi algorithm, with the result that a first item of reliability information is obtained via a correct channel decoding. Furthermore, the data item to be decided is compared with a predicted item from previously transmitted data and, in the event of non-correspondence of the data item with the predicted data item, a change is carried out in the distribution density function which is used for the arithmetic decoding, and the channel-decoded data item is arithmetically decoded with the aid of the changed distribution density function. As a result of this, it is achieved, for example, that a data item wrongly channel-decoded owing to transmission errors is, nevertheless, correctly decoded arithmetically. This renders possible a robust arithmetic decoding method which offers high reliability.

It is particularly advantageous to decode the channel-decoded data arithmetically by means of an unchanged distribution density function, to predict temporally subsequent data from the arithmetically decoded data, and to estimate a second item of reliability information from the predicted data. Thereupon, the first and the second items of reliability information of each data item are compared with one another and the data item of the larger item of reliability information and the larger item of reliability information are selected. A third item of reliability information is estimated in parallel from the data item which was decoded arithmetically with the aid of the changed distribution density function. The third item of reliability information is compared with the selected item of reliability information, and the data item which has the largest item of reliability information is selected as the decided data item. It is achieved, as a result, that the data item having the largest item of reliability information is detected as the decided data item. The probability of deciding a correct data item is thereby further increased.

It is also advantageous to subject the data to channel coding by means of cyclic block codes. In this way, error detection is carried out during channel coding by means of cyclic block codes and an indication is obtained as to whether errors occur during transmission. The reliability is thereby further increased.

DETAILED DESCRIPTION

Figure 1:
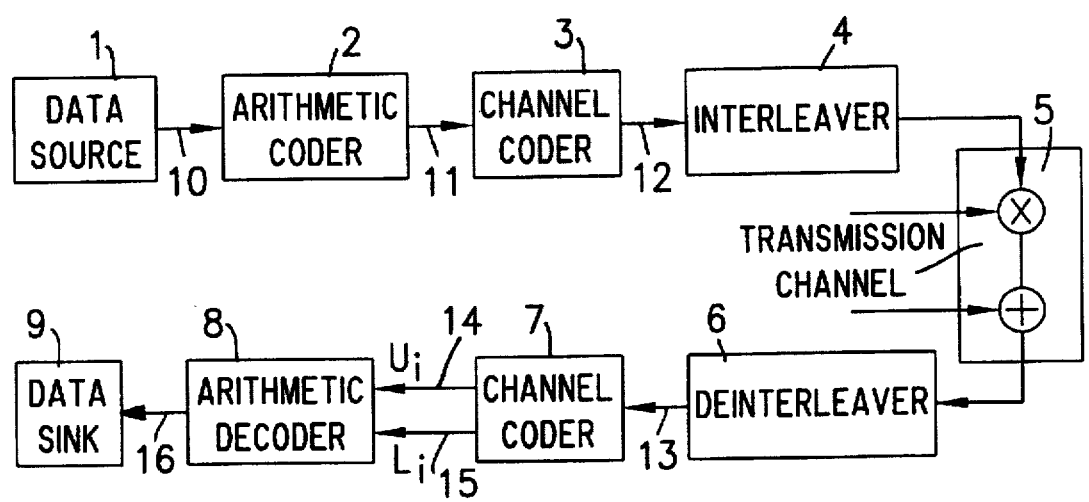
FIG. 1 shows a transmission link according to the present invention.

FIG. 1 shows a transmission link diagrammatically. Image data are supplied in digital form from the data source 1. The data supplied from the data source 1 could, however, also include other information such as, for example, speech. Brightness information of image pixels, for example, is transmitted as image data. The image data are directed from the data source 1 via a first data line 10 to an arithmetic coder 2. The arithmetic coder 2 carries out arithmetic coding of the image data.

Arithmetic coding methods are known and described, for example, in I. H. Witten, et al., "Arithmetic Coding for Data Compression", Communications of the ACM, Computing Practices, June 1987, Volume 30, No. 6, pages 520 ff.

The arithmetically coded image data are led via a first coder line 11 from the arithmetic coder 2 to a channel coder 3. The channel coder 3 carries out convolution coding of the supplied data. Subsequently, the convolution-coded data are passed via a second coder line 12 to an interleaver 4. The interleaver 4 carries out interleaving of the supplied data and passes the processed data to a transmission channel 5. The data are passed by the transmission channel 5 to a deinterleaver 6. The deinterleaver 6 carries out an interleaving process which is inverse to the interleaver 4. Subsequently, the data are led via a third coder line 13 to a channel decoder 7. The channel decoder 7 carries out channel decoding using the soft output Viterbi algorithm (SOVA).

The soft output Viterbi algorithm is known and described, for example, in Hagenauer "A Viterbi Algorithm with Soft-Decision Outputs and its Applications", Global Telecommunications Conference, Dallas, 1989, pages 1680 ff. The channel decoder 7 determines a decided data item $U_i$ and an item $L_i$ of reliability information for each channel-decoded data item. The decided data item $U_i$ is led via a fourth coder line 14 to an arithmetic decoder 8. In addition, the item $L_i$ of reliability information is directed to the arithmetic decoder 8 via a fifth coder line 15. The arithmetic decoder 8 carries out arithmetic decoding of the data using the decided data item and the item of reliability information. The arithmetically decoded data are passed via a second data line 16 to a data sink 9. The data sink 9 is, for example, an image reproduction unit.

Malfunctions of the transmission channel 5 occur during real transmission of data. These malfunctions are represented diagrammatically in FIG. 1 as arrows with a multiplication unit or adder unit. The malfunctions can result in a wrong data item $U_i$ being decided in the channel decoder 7. An indication of this is a small value of the item $L_i$ of reliability information. The method of functioning of the arithmetic decoder 8 is explained with the aid of FIG. 2.

Figure 2:
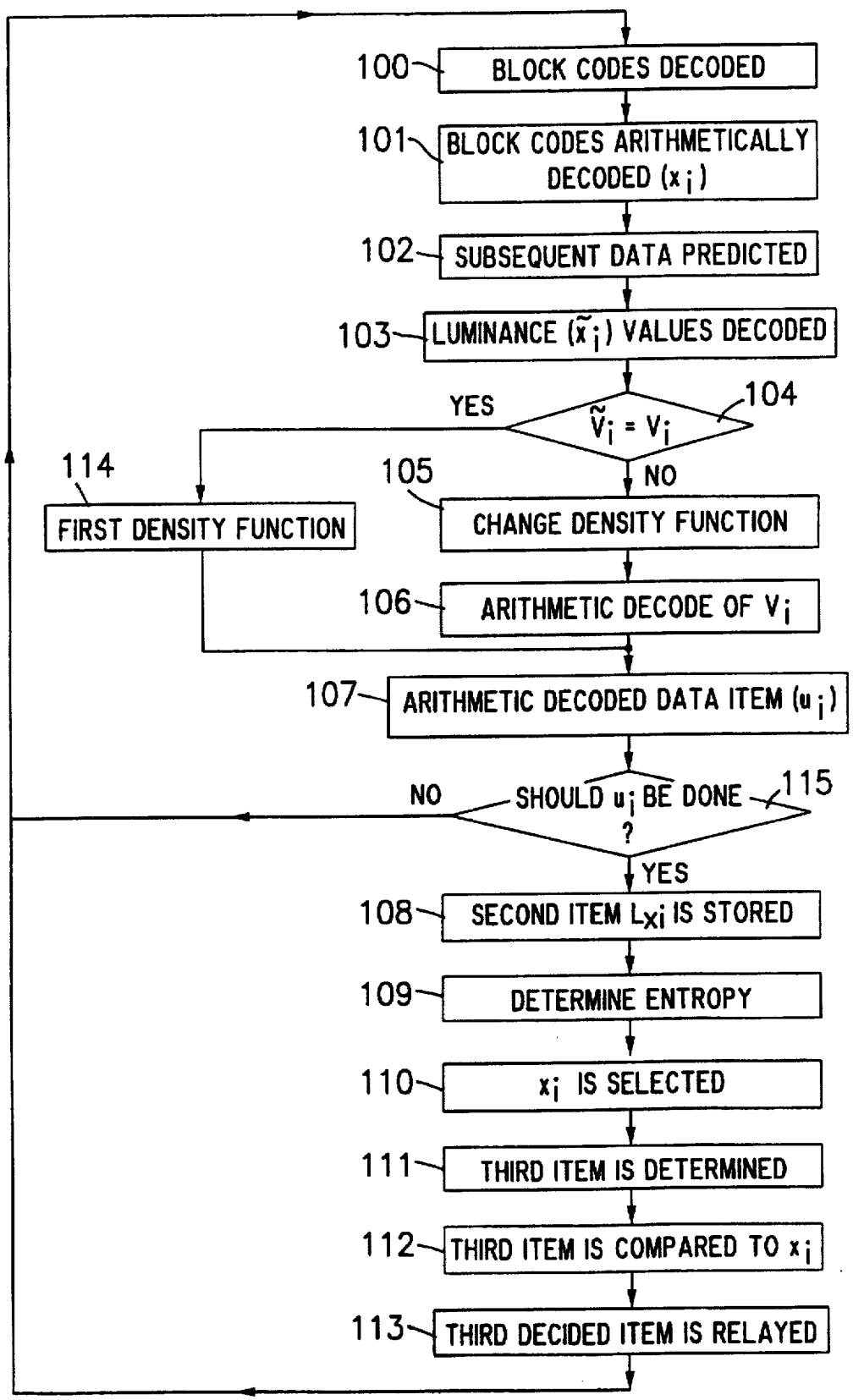
FIG. 2 shows a flow chart according to the present invention.

FIG. 2 describes the method of functioning of the arithmetic decoder 8 in the form of a flow chart.

It is assumed below that the transmitted data have been subjected to cyclic block coding upstream of the channel encoder 3.

A generator polynomial having the function $g(x)=1+x+x^3$ is used as a block coder. Three test bits are added in this case for a prescribed number of data items.

Consequently, cyclic decoding of block codes is carried out at program point 100. Error detection is carried out in this case and permits a statement as to whether the transmitted data have been transmitted erroneously. Cyclic block codes are described, for example, in S. Lin, "Error Control Coding", Prentice-Hall, 1983. The information as to whether an error has occurred during transmission is stored in a memory. The cyclic block code decoded data are copied into a memory. Subsequently, the cyclic block code decoded data are subjected at program point 101 to arithmetic decoding. In this arithmetic decoding, use is made of a distribution density function of the data which was measured previously at the data source 1. The arithmetically decoded data $X_i$ are stored in a memory. The index i denotes the clock pulse of the data item. Temporally subsequent data are predicted at program point 102 from the arithmetically decoded data.

Figure 3:
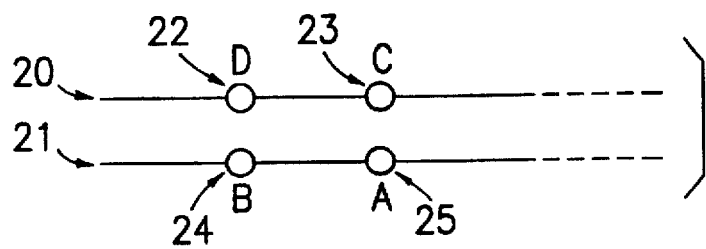
FIG. 3 diagramatically shows pixels.

In the transmission of image data, the luminance values, for example, are transmitted pixel by pixel from left to right and in lines from top to bottom. FIG. 3 shows diagrammatically an image segment which includes successive scanning lines 20, 21. The first scanning line 20 has a first pixel D 22 and a second pixel C 23. The second scanning line 21 exhibits a first pixel B 24 and a second pixel A 25. If the luminance values of the first and second pixels 22, 23 of the first scanning line 20 and of the first pixel 24 of the second scanning line 21 are known, the luminance value of the second pixel 22 of the second scanning line 21 is determined from the luminance values of the first and second pixels 22, 23 of the first scanning line and of the first pixel 24 of the second scanning line 21.

A local linear prediction of third order is carries out in this case. The pixel A is predicted with the aid of pixels B, C and D.

The luminance value $X_A$ at pixel A is calculated in accordance with:

$$\tilde{X}_A = 0.52 * (X_B + X_C) - 0.058 X_D \tag{1}$$

$X_B$, $X_C$ and $X_D$ denoting the luminance values at pixels B, C and D. $\tilde{X}$ defines the predicted luminance values.

The probability density function of the prediction error $e = X - \tilde{X}$ was measured and approximated by a Laplace distribution.

$$p_e = \frac{1}{\sqrt{2}\, \sigma_e} \mathrm{Exp.}^{-(\sqrt{2}\, |e|/\sigma_e)} \tag{2}$$

$\sigma_e$ denotes the standard deviation.

A reliability value $L_{pred}$ can be calculated as follows from the Laplace distribution $p_e$. A mean difference is formed in a representative fashion for the prediction of a prescribed number N of pixels:

$$\bar{e} = 1/N (X_i - \tilde{X}_i) \tag{3}$$

The probability of a correct prediction is:

$$P_r = p_e(\bar{e}) \tag{4}$$

The reliability is then calculated in the form of a log-likelihood ratio:

$$L_{pred} = \log[(1-P_r)/P_r] \tag{5}$$

The predicted luminance values $\tilde{X}hd$ iare buffered in a memory.

At the following program point 103, the predicted luminance values $\tilde{X}_i$ are subjected to arithmetic coding. Arithmetically coded and predicted luminance values $\tilde{V}_i$ are obtained in this way. At the following program point 104, the arithmetically coded and predicted luminance values $\tilde{V}_i$ are compared with the channel-decoded luminance values $V_i$ of the same clock pulse i. In this case, the interrogation is performed as to whether the predicted, arithmetically coded luminance value $\tilde{V}_i$ is equal to the channel-decoded luminance value $V_i$. If this is not the case, a branch is made to program point 105. A change in the distribution density function of the data which is used for the purpose of arithmetic decoding is undertaken at program point 105.

The changes in the distribution density function are described with the aid of FIG. 4. FIG. 4a shows diagrammatically a distribution density function of the data which were measured, for example, at the data source 1. A value range from 0 to 1 is subdivided in this case into individual component value ranges. The limits of the component value ranges are formed by cumulative probabilities $P_i$. The cumulative probabilities $P_i$ are calculated as follows:

$$P_i = \sum_{j=1}^{i} P_j; i = 1, \ldots, N-1; P_o = 0, P_N = 1 \tag{6}$$

$P_j$ denoting the probability of occurrence of a symbol $S_i$ of the data source 1. Each sequence of symbols $S_i$ is assigned to a real number C with the aid of the arithmetic coding. The real number C is formed in accordance with the formula $C_{i+1} = C_i + I_i \cdot P_{i+1}$.

The interval $I_i$ represents the value region from 0 to 1. The following intervals $I_{i+1}$ are determined according to the formula $I_{i+1} = I_i \cdot P_i$.

For decoding, the real number $C_i$ is compared with the cumulative probabilities $P_i$. It is seen from the following comparison that the symbol $S_i$ was decoded if $P_i < C_i < P_{i+1}$. It then holds that $C_{i+1} = C_i - P_i$, and a new interval $I_{i+1} = I_i / P_i$ is formed, the new interval again being subdivided in accordance with the cumulative probabilities. The new real number $C_{i+1}$ is again compared with the cumulative probabilities of the new interval $I_{i+1}$, and a further symbol $S_{i+1}$ is decoded.

Given the use of binary symbols of the data source 1, two cases can be distinguished. If the decided data item is $U_j=0$, the corresponding item $L_j$ of reliability information specifies the reliability that a transmitted second number $C_2$ is longer in terms of symbols than a received first number $C_1$ in the terms of symbols, since $U_j=0$ could, after all be wrongly detected instead of $U_j=1$.

Figure 4A:
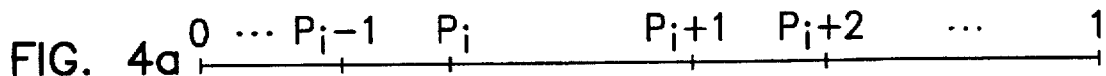
FIGS. 4a–4f show a diagrammatic representation of the arithmetic decoding according to the present invention.
Figure 4B:
Figure 4C:

The received number $C_1$ is represented diagrammatically in FIG. 4b. The transmitted number $C_2$ is represented diagrammatically in FIG. 4c. In this case, when the number $C_1$ of the received symbols falls in the component value range between $P_i$ and $P_{i+1}$ of the distribution density function, the cumulative probability $P_{i+1}$ is assigned a new value $P_{i+1}$, the reliability information being taken into account in this case.

Figure 4D:
Figure 4E:
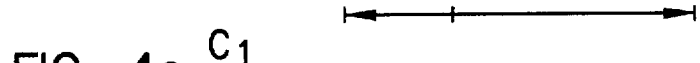
Figure 4F:
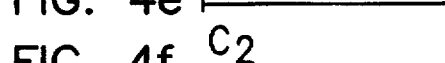

If, by contrast, the decided data item $U_j$ is equal to the numeral 1, the corresponding item $L_j$ of reliability information denotes that the number $C_2$ of the transmitted symbols $U_j$ is less than or equal to the number $C_1$ of the received symbols $U_j$, since although a numeral 1 has been detected it is, after all, possible that a numeral 0 has been sent. This means that the cumulative probability $P_i$ must be updated, taking into account the reliability information. This case is represented in FIGS. 4d, 4e and 4f. The updating of the cumulative probabilities $P_i$ and $P_{i+1}$ is performed by the following formulae:

$$P_{i,new} = (1-L_j)(P_{i,old} + 2^{-j}) + L_j P_{i,old} \quad (7)$$

$$P_{i+1,new} = (1-L_j)(P_{i+1,old} + 2^{-j}) + L_j P_{i+1,old} \quad (8)$$

the index j representing a running variable by means of which the data of the data source 1 are enumerated within a prescribed number of data bits, for example one line of an image.

If the data item $U_j$ have been reliably decoded, the result of the item $L_j$ of reliability information is then the value 1, that is to say the cumulative probabilities $P_i$ and $P_{i+1}$ maintain their values. In the case of an extremely unreliable channel decoding, the item $L_j$ of reliability information takes the value 0, that is to say actualization is performed according to formulae (7) and (8). This updating corresponds in the case of binary data to inverting a bit or an integral number of data bits. If the item $L_j$ of reliability information assumes intermediate values, the described updating corresponds to inverting a non-integral number of data bit. It must be ensured that no impossible events occur by virtue of updating the distribution density function. The values of the cumulative probabilities $P_i$ are ordered in terms of size: $P_1 < P_2 < \ldots P_{i+1} < P_i < P_{i+1} < \ldots P_n$. This order must also be maintained after the updating. So that this condition always remains fulfilled, an intermediate variable a which can assume values between 0 and 1 is introduced. Equation (7) can be written as follows with the aid of the intermediate variables:

$$P_{i,new} = (1-L_j)[(1-a)P_{i+1} + aP_{i+1}] + L_j P_{i,old} \quad (9)$$

where $$a = \begin{cases} 0 & (P_{i,old} + 2^{-j}) < P_{i-1} \\ \left[\dfrac{((P_{i,old} + 2^{-j}) - P_{i-1})}{P_{i+1} - P^{j-1}}\right] & P_{i-1} \leq (P_{i,old} + 2^{-j}) \leq P_{i+1} \\ 1 & P_{i+1} < (P_{i,old} + 2^{-j}) \end{cases}$$

$$P_{i+1,new} = (1-L_j)[(1-b)P_i + bP_{i+2}] + L_j P_{i+1,old} \quad (10)$$

where $$b = \begin{cases} 0 & (P_{i+1,old} - 2^{-j}) < P_i \\ \left[\dfrac{((P_{i+1,old} - 2^{-j}) - P_i)}{P_{i+2} - P_i}\right] & P_i \leq (P_{i+1,old} - 2^{-j}) \leq P_{i+2} \\ 1 & P_{i+2} < (P_{i+1,old} - 2^{-j}) \end{cases}$$

The described formulae for updating the distribution density function can also have a different appearance depending on the application.

If the result of the interrogation at program point 104 is that the predicted and arithmetically coded data item $\tilde{V}_i$ is equal to the channel-decoded data item $V_i$, a branch is made after program point 114. Arithmetic decoding of the channel-decoded data item $V_i$ is performed at program point 114 by means of the first distribution density function. A branch is subsequently made after program point 107.

Arithmetic decoding of the channel-decoded data item $V_i$ is performed at program point 106 with the aid of the changed distribution density function. If the channel-decoded data item represents a numeral 0, a new upper limit $P_{i+1}$ in accordance with formula (8) or (10) is used in the arithmetic decoding. If the channel-decoded data item $V_i$ represents a numeral 1, a new lower limit $P_i$ in accordance with formula (7) or (9) is used in the arithmetic decoding. Subsequently, storing of the arithmetically decoded data item as first decided data item $U_i$ (1) is performed at program point 107.

Interrogation is subsequently performed at program point 115 as to whether further processing of the first decided data item is to be performed or not. If, in the case of a simple method, no further processing of the first decided data item is to be performed, a branch back to program point 100 is made. If, however, further processing is to be performed, a second item $L_{xi}$ of reliability information is calculated with the aid of formula 95) from the stored predicted data item $X_i$ and stored at program point 108.

At the following program point 109, the following formula:

$$H(L) = -\sum_n p(L_n) \log_2 p(L_n),$$

is used to determine an entropy $H(L)$ of the reliability information of a prescribed number N of data bits from the item $L_i$ of reliability information of the decided data $p(L_n)$ denoting the probability of occurrence of the value $L_n$. L denotes a vector in accordance with the following formula: $L = (L_1, L_2, \ldots, L_n)$. In this exemplary embodiment, the number of data bits which is required to represent the pixels of an image is used as the prescribed number N of data bits. An updating value E is calculated from temporally successive scanning lines according to the following formula: $E_{i,(i-1)} = 10 \log_{10} H(L_i)/H(L_{i-1})$. In this case, the index i or i−1 denotes the scanning line i or i−1. $L_i$ in this case represents an item of reliability information averaged over the scanning line i. The updating value is buffered.

The arithmetically decoded data item $x_i$ is selected at program point 110 as seconded decided data item $U_i$ (1) with the corresponding item $L_i$ of reliability information when the error rate of the BCH decoding is below a prescribed value, when the updating value is smaller than a prescribed threshold, and when the item $L_i$ of reliability information is larger than the second item $L_{xi}$ of reliability information determined from the predicted data item. In all other cases, the predicted data item $\tilde{X}_i$ is determined as second decided data item with the aid of the second item $L_{xi}$ of reliability information. Instead of the first item $L_i$ of reliability information averaged over a scanning line, it is also possible to use an item of reliability information for each pixel. The updating value Ei, i−1 then also formed for each pixel.

Program point 111 follows thereupon, at which a third item of reliability information is determined according to formula (5) from the first decided data item $X_i$ by using a Laplace distribution. Subsequently, a comparison of the third item or reliability information with the item of reliability information selected in program step 110 is performed at program point 112, the data item with the largest item of reliability information being selected as the third decided data item. Subsequently, the third decided data item is relayed at program point 113 to the data sink 9 and a branch is made back to program point 100.

The cyclic block coding can be eliminated in the case of a simple channel coding method.

The principle of arithmetic coding is described with the aid of the following simple example.

We consider an alphabet having N=5 symbols A, B, C, D and E having the following probabilities of occurrence and cumulative probabilities:

$P_A$=0.07; $P_A$=0.00
$P_B$=0.30; $P_B$=0.07
$P_C$=0.09; $P_C$=0.37
$P_D$=0.42; $P_D$=0.46
$P_E$=0.12; $P_E$=0.88

The arithmetic code for the symbol sequence CBD is then formed.

The result for symbol C as initial point $C_c$ and as interval $I_c$ in accordance with the following calculation is:

$$\begin{aligned} C_c &= C_o + I_o * P_o \\ &= 0.0 + 1.0 * 0.37 = 0.37 \\ I_c &= I_o * P_c \\ &= 1.0 * 0.09 = 0.09 \end{aligned}$$

0.0 was used for the initial value $C_o$, and 1.0 was used for the initial interval $I_o$.

For the symbol B, which follows the symbol C, the following values result for the initial point $C_{CB}$ and for the interval $I_{CB}$:

$$\begin{aligned} C_{CB} &= C_c + I_c * P_B \\ &= 0.37 + 0.09 * 0.07 = 0.3763 \\ I_{CB} &= I_c * P_B \\ &= 0.09 * 0.30 = 0.027 \end{aligned}$$

For the symbol D, which follows the symbols C and B, the following values result for the initial point $C_{CBD}$ and the interval $I_{CBC}$:

$$\begin{aligned} C_{CBD} &= C_{CB} + I_{CB} * P_D \\ &= 0.3763 + 1.027 * 0.46 = 0.38872 \\ I_{CBD} &= I_{CB} * P_D \\ &= 0.027 * 0.42 = 0.01134 \end{aligned}$$

As may be seen from this example, it is necessary to introduce an end of string (EOS) codeword. The binary representation of $C_{CBD}$=0.38872=(0.011000111 ... ) must be transmitted. Since, however, each real number in the range between 0.38872 and 0.40006 represents the same message, only the binary number 011000111 has to be transmitted.

The receiver receives the bit sequence $C_{cmp}$=011000111 ... We obtain by interval search:

$P_C$<$I$=$C_{cmp}$=0.38872<$P_D$ → the first symbol is C
$C_{new}$=($C_{old}$−$P_C$)/$P_D$=0.01872/0.09=0.208
$P_B$<$I$=$C_{new}$=0.208<$P_C$ → the second symbol is B
$C_{new}$=($C_{old}$−$P_B$)/$P_B$=0.0138/0.3=0.46
$P_D$<$I$=$C_{new}$=0.46<$P_E$ → the last symbol is D.

The symbol sequence CBD is determined in this way from the bit sequence $C_{cmp}$=011000111 by arithmetic decoding.

What is claimed is:

1. A method for arithmetically-decoding data, comprising the steps of:
   channel-decoding channel-coded data using a soft Viterbi algorithm;
   determining at least one first item of reliability information;
   storing the channel-decoded data;
   determining arithmetically-decoded data as a function of the channel-decoded data;
   predicting data from a predetermined number of the arithmetically-decoded data;
   arithmetically-coding the predicted data;
   comparing the predicted data with corresponding stored channel-decoded data; and
   if the predicted data does not correspond to the channel-decoded data:
      decreasing an upper value of a value range of a distribution density function into which the channel-data falls, given a first value of the channel-decoded data and a determined small first item of reliability information,
      increasing a lower value of the value range of the distribution density function, given a second value, greater than the first value, of the channel-decoded data and a determined small first item of reliability information.

2. The method according to claim 1, wherein the predicted data and the corresponding stored channel-decoded data that are compared are at least one of spatially identical and temporally identical.

3. The method according to claim 1, further comprising the steps of:
   determining the distribution density function; and
   changing the determined distribution density function.

4. The method according to claim 1, further comprising the steps of:
   determining a second item of reliability information as a function of a predetermined number of the predicted data;
   calculating a measure of freedom from error of a predetermined number of data as a function of the first item of reliability information;
   selecting the arithmetically-decoded data and the first item of reliability information if the measure of freedom from error is greater than a predetermined threshold value and the second item of reliability information is less than the first item of reliability information, otherwise selecting the predicted data and the second item of reliability information;
   forming a third item of reliability information as a function of the arithmetically-decoded data;
   comparing the third item of reliability information with one of the selected first item and the selected second item of reliability information; and
   using the largest item of reliability information as the decided data item.

5. The method according to claim 4, wherein the measure of freedom from error is calculated in the form of an entropy.

6. The method according to claim 4, wherein:
   the channel-coded data are coded and decoded using cyclic block codes;
   error detection is carried out in the cyclic block code decoding; and
   the arithmetically-decoded data is selected as the decided data item only when a detected number of errors is less than a predetermined threshold value.

7. The method according to claim 4, further comprising the step of averaging at least one of the first, second and third items of reliability information over a predetermined number of data items.

8. The method according to claim 6, further comprising the steps of:

determining a measure of erroneously transmitted data; and averaging the measure over a predetermined number of data items.

* * * * *

UNITED STATES PATENT AND TRADEMARK OFFICE
CERTIFICATE OF CORRECTION

PATENT NO. : 5,737,345
DATED : April 7, 1998
INVENTOR(S) : R.M. Pelz et al.

It is certified that error appears in the above-identified patent and that said Letters Patent is hereby corrected as shown below:

Column 1, line 20, "Bildund" should be --"Bild-und --;

Column 3, line 54, is illegible and should read;

$$--p_e = \frac{1}{\sqrt{2}\sigma_e} \text{Exp.}^{-(\sqrt{2}|e|/\sigma_e)} \quad (2) --;$$

Column 3, line 65, should read -- $Pr = p_e(e)$ --;

Column 4, line 5, "Xhd iare" should be -- $\tilde{X}_i$ --.

Signed and Sealed this

Twenty-fourth Day of November, 1998

BRUCE LEHMAN

*Attest:*

*Attesting Officer*  Commissioner of Patents and Trademarks